United States Patent
Zou et al.

(10) Patent No.: US 11,023,412 B2
(45) Date of Patent: *Jun. 1, 2021

(54) RDMA DATA SENDING AND RECEIVING METHODS, ELECTRONIC DEVICE, AND READABLE STORAGE MEDIUM

(71) Applicant: ADVANCED NEW TECHNOLOGIES CO., LTD., Grand Cayman (KY)

(72) Inventors: Yinchao Zou, Hangzhou (CN); Changqing Li, Hangzhou (CN); Changhua He, Hangzhou (CN); Peng Wu, Hangzhou (CN); Jincan Kong, Hangzhou (CN)

(73) Assignee: ADVANCED NEW TECHNOLOGIES CO., LTD., George Town (KY)

( * ) Notice: Subject to any disclaimer, the term of this patent is extended or adjusted under 35 U.S.C. 154(b) by 0 days.

This patent is subject to a terminal disclaimer.

(21) Appl. No.: 17/065,684

(22) Filed: Oct. 8, 2020

(65) Prior Publication Data

US 2021/0089492 A1 Mar. 25, 2021

Related U.S. Application Data

(63) Continuation of application No. 16/854,740, filed on Apr. 21, 2020, now Pat. No. 10,817,460, which is a
(Continued)

(30) Foreign Application Priority Data

Aug. 28, 2019 (CN) .......................... 201910802307.6

(51) Int. Cl.
*G06F 3/06* (2006.01)
*G06F 15/173* (2006.01)
(Continued)

(52) U.S. Cl.
CPC ...... *G06F 15/17331* (2013.01); *G06F 3/0655* (2013.01); *G06F 11/3041* (2013.01);
(Continued)

(58) Field of Classification Search
CPC .... G06F 3/0655; G06F 3/0641; G06F 3/0643; G06F 3/0656; G06F 11/3041;
(Continued)

(56) References Cited

U.S. PATENT DOCUMENTS

| | | | |
|---|---|---|---|
| 7,245,627 | B2 | 7/2007 | Goldenberg et al. |
| 7,620,693 | B1 | 11/2009 | Mott et al. |

(Continued)

FOREIGN PATENT DOCUMENTS

| | | |
|---|---|---|
| CN | 101047714 A | 10/2007 |
| CN | 101047720 A | 10/2007 |

(Continued)

OTHER PUBLICATIONS

First Search for Chinese Application No. 201910802307.6 dated Apr. 12, 2020.
(Continued)

*Primary Examiner* — Le H Luu

(57) ABSTRACT

A Remote Direct Memory Access (RDMA) data sending method is disclosed. The method is applicable to a sending end, with a data-transmission RDMA device disposed thereon. The method includes: the data-transmission RDMA device acquiring raw data; the data-transmission RDMA device compressing the raw data by using a preset compression method to obtain compressed data; and the data-transmission RDMA device encapsulating the compressed data into a data packet, and transmitting the data packet to a receiving end. The data packet may include a method tag corresponding to the preset compression method. In this method, the compression and transmission of the raw data
(Continued)

US 11,023,412 B2
Page 2 are conducted by the data-transmission RDMA device on the hardware level.

20 Claims, 7 Drawing Sheets

Related U.S. Application Data continuation of application No. PCT/CN2020/072161, filed on Jan. 15, 2020.

(51) Int. Cl.
| | |
|---|---|
| *G06F 12/0868* | (2016.01) |
| *G06F 11/30* | (2006.01) |
| *H04L 29/08* | (2006.01) |
| *G06F 13/28* | (2006.01) |
| *H04W 8/22* | (2009.01) |
| *H04W 8/20* | (2009.01) |
| *H03M 7/30* | (2006.01) |

(52) U.S. Cl.
CPC .......... *G06F 12/0868* (2013.01); *G06F 13/28* (2013.01); *H04L 29/08117* (2013.01); *H04W 8/205* (2013.01); *H04W 8/22* (2013.01); *H03M 7/30* (2013.01)

(58) Field of Classification Search
CPC .. G06F 12/0868; G06F 13/28; G06F 13/4295; G06F 15/17331; G06F 16/1858; G06F 9/455; G06F 9/544; H03M 7/30; H04L 29/08117; H04L 1/0006; H04L 12/4641; H04L 45/74; H04L 47/39; H04L 63/0435; H04L 67/1097; H04L 67/125; H04L 9/0643; H04W 8/205; H04W 8/22; H04W 28/06; H04W 4/70; H04N 21/6437
See application file for complete search history.

(56) References Cited

U.S. PATENT DOCUMENTS

| | | |
|---|---|---|
| 7,813,369 B2 | 10/2010 | Blackmore et al. |
| 7,817,634 B2 | 10/2010 | Coffman et al. |
| 7,870,217 B2 | 1/2011 | Pandya |
| 7,953,085 B2 | 5/2011 | Chang et al. |
| 8,095,763 B2 | 1/2012 | Piszczek et al. |
| 8,233,380 B2 | 7/2012 | Subramanian et al. |
| 8,458,280 B2 | 6/2013 | Hausauer et al. |
| 8,510,265 B1 | 8/2013 | Boone et al. |
| 8,595,385 B1 | 11/2013 | Shapiro et al. |
| 8,687,804 B2 | 4/2014 | Dillaway |
| 9,529,542 B2 | 12/2016 | Friedman et al. |
| 9,596,076 B1 | 3/2017 | Axnix et al. |
| 10,366,002 B2 | 7/2019 | Atkisson et al. |
| 2006/0179119 A1* | 8/2006 | Kurosawa ............. H04L 67/125 709/217 |
| 2006/0274788 A1 | 12/2006 | Pong |
| 2006/0274789 A1 | 12/2006 | Pong |
| 2008/0002578 A1 | 1/2008 | Coffman et al. |
| 2008/0313364 A1* | 12/2008 | Flynn .................... G06F 3/0652 710/31 |
| 2009/0010429 A1* | 1/2009 | Kim .................... H04N 21/6437 380/200 |
| 2012/0189023 A1* | 7/2012 | Huang ................. H04L 1/0006 370/477 |
| 2012/0275424 A1 | 11/2012 | Chen et al. |
| 2013/0018857 A1* | 1/2013 | Voll ....................... G06F 3/0641 707/693 |
| 2013/0039487 A1* | 2/2013 | McGrew ............. H04L 63/0435 380/44 |
| 2014/0258438 A1* | 9/2014 | Ayoub .................... G06F 13/28 709/212 |
| 2014/0289447 A9 | 9/2014 | Flynn et al. |
| 2015/0334034 A1* | 11/2015 | Smedley ................ H04L 47/39 709/219 |
| 2016/0277245 A1* | 9/2016 | Wei ...................... H04L 12/4641 |
| 2017/0034315 A1 | 2/2017 | Vajravel |
| 2017/0075856 A1* | 3/2017 | Suzue ............... G06F 15/17331 |
| 2017/0078916 A1* | 3/2017 | Wang ..................... H04L 69/08 |
| 2017/0357611 A1* | 12/2017 | Cherian ................. H04L 45/74 |
| 2017/0371835 A1* | 12/2017 | Ranadive ............... G06F 9/544 |
| 2018/0095915 A1* | 4/2018 | Prabhakar ............. H04L 47/36 |
| 2018/0131609 A1* | 5/2018 | Wei ....................... H04L 69/16 |
| 2018/0189313 A1* | 7/2018 | Sun ......................... H03M 7/30 |
| 2019/0021069 A1* | 1/2019 | Chun ...................... H04W 4/70 |
| 2019/0141041 A1* | 5/2019 | Bhabbur ................ H04L 9/3213 |
| 2019/0146682 A1* | 5/2019 | Subramanian .... G06F 15/17331 711/103 |
| 2019/0163364 A1* | 5/2019 | Gibb ...................... G06F 3/0629 |
| 2019/0303003 A1* | 10/2019 | Freyensee ............. G06F 3/0656 |
| 2020/0142866 A1* | 5/2020 | Rubenstein ....... G06F 15/17331 |

FOREIGN PATENT DOCUMENTS

| | | |
|---|---|---|
| CN | 101977402 A | 2/2011 |
| CN | 102045772 A | 5/2011 |
| CN | 102131234 A | 7/2011 |
| CN | 106033377 A | 10/2016 |
| CN | 108616927 A | 10/2018 |

OTHER PUBLICATIONS

First Office Action dated Apr. 16, 2020, issued in related Chinese Application No. 201910802307.6, with English machine translation (27 pages).

Second Office Action dated Jul. 13, 2020, issued in related Chinese Application No. 201910802307.6, with English machine translation (22 pages).

\* cited by examiner

RDMA DATA SENDING AND RECEIVING METHODS, ELECTRONIC DEVICE, AND READABLE STORAGE MEDIUM

CROSS-REFERENCE TO RELATED APPLICATION

This application is a continuation application of U.S. patent application Ser. No. 16/854,740, filed on Apr. 21, 2020, which is a continuation application of International Patent Application No. PCT/CN2020/072161, filed on Jan. 15, 2020, which is based on and claims priority of the Chinese Patent Application No. 201910802307.6, filed on Aug. 28, 2019. The above-referenced applications are incorporated herein by reference in their entirety.

TECHNICAL FIELD

The present application relates to the technical field of data processing, and more specifically, to Remote Direct Memory Access (RDMA) data sending and receiving methods, an electronic device, and a readable storage medium.

BACKGROUND

RDMA technologies can be used to resolve a latency in server-side data processing during network transmission, and therefore are attracting increasingly enthusiastic attention in modern enterprise-level data centers and have been adopted in more and more applications. As a network communication technique with high throughput and low latency, RDMA is especially tailored for large-scale parallel computer clusters. With the explosive increase of data transmitted over the network, efficient utilization of network bandwidth becomes essential in exploiting full performance potential of the RDMA technologies. Therefore, a method to improve the transmission efficiency of an RDMA network is urgently needed.

SUMMARY

The embodiments of this specification provide data sending and receiving methods, an apparatus, an electronic device, and a readable storage medium to effectively improve RDMA transmission efficiency.

One aspect of this specification is directed to an RDMA data sending method, applicable to a sending end, with a data-transmission RDMA device disposed thereon. The RDMA data sending method may include: acquiring raw data by the data-transmission RDMA device; compressing, by the data-transmission RDMA device, the raw data by using a preset compression method to obtain compressed data; and encapsulating, by the data-transmission RDMA device, the compressed data into a data packet, and transmitting the data packet to a receiving end. The data packet may include a method tag corresponding to the preset compression method.

Another aspect of this specification is directed to an RDMA data receiving method, applicable to a receiving end, with a data-receiving RDMA device disposed thereon. The RDMA data receiving method may include: receiving, by the data-receiving RDMA device, a data packet sent from a sending end, wherein the data packet include compressed data and a method tag corresponding to a preset compression method, and the data packet is obtained by the sending end by compressing raw data using the preset compression method and then encapsulating the compressed data; determining, by the data-receiving RDMA device, the preset compression method according to the method tag; determining, by the data-receiving RDMA device, a decompression algorithm according to the preset compression method; and decompressing, by the data-receiving RDMA device, the compressed data using the decompression algorithm to obtain the raw data.

Another aspect of this specification is directed to a sending end, with a data-transmission RDMA device disposed thereon. The sending end may include a raw data acquisition unit, a compression unit, an encapsulation unit, and a data sending unit.

The raw data acquisition unit may be configured to acquire raw data via the data-transmission RDMA device. The compression unit may be configured to control the data-transmission RDMA device to compress the raw data using a preset compression method to obtain compressed data. The encapsulation unit may be configured to encapsulate the compressed data into a data packet via the data-transmission RDMA device. The data packet may include a method tag corresponding to the preset compression method. The data sending unit may be configured to transmit the data packet to a receiving end via the data-transmission RDMA device.

Another aspect of this specification is directed to a receiving end, with a data-receiving RDMA device disposed thereon. The receiving end may include a data receiving unit, a compression method acquisition unit, a decompression method acquisition unit, and a decompression unit.

The data receiving unit may be configured to receive, via the data-receiving RDMA device, a data packet sent from a sending end. The data packet may include compressed data and a method tag corresponding to a preset compression method, and the data packet may be obtained by compressing, by the sending end, raw data using the preset compression method and then encapsulating the compressed data. The compression method acquisition unit may be configured to determine the preset compression method via the data-receiving RDMA device according to the method tag. The decompression method acquisition unit may be configured to determine a decompression algorithm via the data-receiving RDMA device according to the preset compression method. The decompression unit may be configured to decompress, via the data-receiving RDMA device, the compressed data using the decompression algorithm to obtain the raw data.

Another aspect of this specification is directed to an RDMA data transmission method. The method may include: acquiring, by a data-transmitting RDMA device, raw data; compressing, by the data-transmitting RDMA device, the raw data using a preset compression method to obtain compressed data; encapsulating, by the data-transmitting RDMA device, the compressed data into a data packet, wherein the data packet includes a method tag corresponding to the preset compression method; and transmitting, by the data-transmitting RDMA device, the data packet to a receiving device.

Another aspect of this specification is directed to an RDMA data transmission system. The system may include a data-transmitting RDMA device having a memory configured with instructions executable to acquire raw data; compress the raw data using a preset compression method to obtain compressed data; encapsulate the compressed data into a data packet; and transmit the data packet to a data-receiving RDMA device.

Another aspect of this specification is directed to an RDMA data transmission system comprising a sending-end apparatus and a receiving-end apparatus. The sending-end apparatus may include a data-transmitting RDMA device, and the receiving-end apparatus may include a data-receiving RDMA device.

The sending-end apparatus may be configured to: acquire, by the data-transmitting RDMA device, raw data; compress, by the data-transmitting RDMA device, the raw data using a preset compression method to obtain compressed data; encapsulate, by the data-transmitting RDMA device, the compressed data into a data packet, wherein the data packet includes a method tag corresponding to the preset compression method; and transmit, by the data-transmitting RDMA device, the data packet to the data-receiving RDMA device.

The receiving-end apparatus may be configured to: receive, by the data-receiving RDMA device, the data packet sent from the sending-end apparatus; determine, by the data-receiving RDMA device and according to the method tag in the data packet, the preset compression method; determine, by the data-receiving RDMA device and according to the preset compression method, a decompression algorithm; and decompress, by the data-receiving RDMA device, the compressed data using the decompression algorithm to obtain the raw data.

Another aspect of this specification is directed to an electronic device comprising a memory, a processor, and a computer program stored in the memory and executable on the processor. Upon being executed by the processor, the program may cause the processor to perform any one of the above-described data receiving and sending methods.

Another aspect of this specification is directed to a computer-readable storage medium having instruction stored thereon executable by a processor to cause the processor to perform operations. The operations may include any one of the above-described data receiving and sending methods.

Some embodiments of this specification have the following beneficial effects.

According to the above-described technical solutions, an RDMA device may compress raw data, encapsulate the compressed data into a data packet, and transmit the data packet to a receiving end. During the transmission process of the data packet to the receiving end, the raw data is compressed by the RDMA device before being transmitted. Since the volume of the compressed data is smaller than that of uncompressed data, the amount of data needs to be transmitted may be reduced. With the data transmission capacity in a unit time remains unchanged, reduced data amount to be transmitted leads to improved data transmission efficiency. Thus, this method may improve the data transmission efficiency.

Additionally, since the transmitted data packet includes a method tag corresponding to the preset compression method, the receiving end can decompress the compressed data according to the method tag in the received data packet to obtain the raw data. Thus, the integrity of the received data can be ensured.

DETAIL DESCRIPTION OF THE EMBODIMENTS

In order to better illustrate the above-described technical solutions, the technical solutions of some embodiments of the specification are described in detail below in combination with the accompanying drawings and specific embodiments. It should be understood that the embodiments of the specification and specific features in the embodiments are detailed descriptions of the technical solutions of the embodiments of the specification, rather than limiting the technical solutions of the specification. Some embodiments of the specification and the technical characteristics of the embodiments can be mutually combined without conflictions.

In some embodiments of the specification, Remote Direct Memory Access (RDMA) is used to resolve a latency in server-side data processing during network transmission. An RDMA device may directly transmit data to a storage of a computer through a network, so as to rapidly move the data from one system to the storage of a remote system without causing any impacts on the operating system, and with miniature processing power of the computer. The communication through an RDMA device eliminates the overhead associated with data duplication on external memory and context switch, thereby releasing the memory bandwidth and the CPU cycles for improved performance of an application system.

Figure 1:
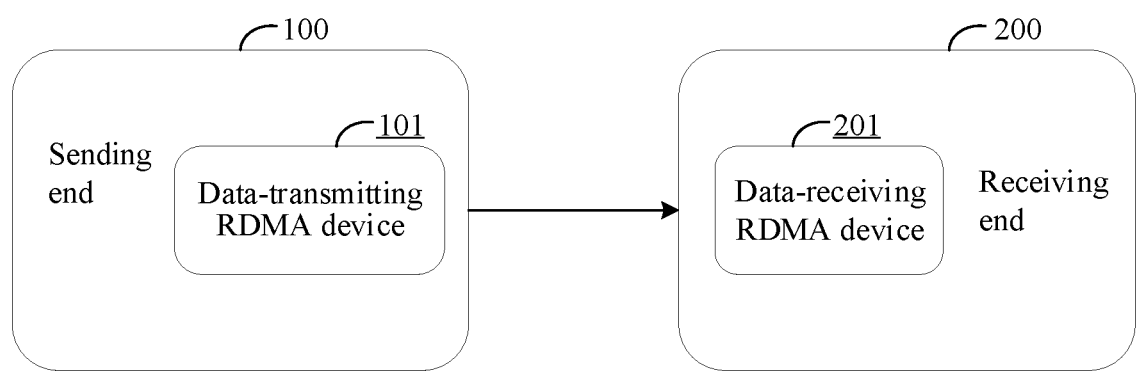
FIG. 1 shows a system architecture diagram illustrating an RDMA data transmission system according to an embodiment of this specification.

According to a first aspect, as shown in FIG. 1, this specification first provides an RDMA data transmission system comprising a sending end 100 and a receiving end 200.

The sending end 100 may be configured to: acquire to-be-sent raw data via a data-transmission RDMA device 101; compress, via the data-transmission RDMA device 101, the raw data using a preset compression method to obtain compressed data; and encapsulate the compressed data into a data packet via the data-transmission RDMA device 101, and transmit the data packet to the receiving end 200. The data packet may include a method tag corresponding to the preset compression method.

The receiving end 200 may be configured to: receive the data packet via a data-receiving RDMA device 201; determine the preset compression method via the data-receiving RDMA device 201 according to the method tag; determine a decompression algorithm via the data-receiving RDMA device 201 according to the preset compression method; and decompress, via the data-receiving RDMA device 201, the compressed data using the decompression algorithm to obtain the raw data.

In some embodiments of the specification, the sending end 100 and the receiving end 200 may each be an electronic device, such as a notebook computer, a desktop computer, a smart mobile phone, a smart watch, an all-in-one machine, and a tablet computer. Further, the data-transmission RDMA device 101 may be disposed at the sending end 100, and the data-receiving RDMA device 201 may be disposed at the receiving end 200. The data-transmission RDMA device 101 and the data-receiving RDMA device 201 may each be an RDMA network interface card, an RDMA chip, or the like. For ease of description and without limiting, in the following description, an RDMA network interface card may be used as an example of the data-transmission RDMA device 101 or the data-receiving RDMA device 201.

In some embodiments of the specification, the data-transmission RDMA device 101 may compress the raw data and transmit the compressed data on a hardware level. Correspondingly, the data-receiving RDMA device 201 may decompress the compressed data on the hardware level and then store the raw data directly in a storage device of the receiving end 200.

The sending end 100 may first acquire the raw data, which may be, for example, 20 bytes of characters, from storage hardware of the sending end 100. The sending end 100 may transmit the raw data to the data-transmission RDMA device 101 after acquiring the raw data. Alternatively, the data-transmission RDMA device 101 may directly read the raw data. After acquiring the raw data, the data-transmission RDMA device 101 may compress the raw data using the preset compression method to obtain the compressed data. Next, the data-transmission RDMA device 101 may encapsulate the compressed data to obtain the data packet, and then transmit the data packet to the receiving end 200 using the Internet or a local area network.

During this process, the data-transmission RDMA device 101 may compress the raw data, encapsulate the compressed data into the data packet, and transmit the data packet to the receiving end 200. Since the raw data is compressed by the data-transmission RDMA device 101 before being transmitted, the volume of the compressed data is smaller than that of uncompressed data. Therefore, the amount of data needs to be transmitted may be reduced. With the data transmission capacity in a unit time remains unchanged, reduced data amount to be transmitted leads to improved data transmission efficiency. Thus, this method may improve the data transmission efficiency.

After acquiring the raw data, the sending end 100 may call an RDMA application interface (e.g., Verbs API) to send a data sending command to the data-transmission RDMA device 101. The data sending command may include a data compression instruction. Upon receiving the data sending command, the data-transmission RDMA device 101 may first acquire the data compression instruction from the data sending command, acquire the preset compression method according to the data compression instruction, and compress the raw data using the preset compression method to obtain the compressed data. The data-transmission RDMA device 101 may further encapsulate the compressed data to obtain the data packet, and, in response to the data sending command, transmit the data packet to the receiving end 200 over the Internet or a local area network.

In some embodiments of the specification, after receiving the data sending command, the data-transmission RDMA device 101 may select, from a supported compression method set, a compression method as the preset compression method. The compression method set may include one or more of the Lempel-Ziv-Welch (LZW) compression algorithm, the Lempel-Ziv-Oberhumer (LZO) compression algorithm, the Lempel-Ziv-Markov chain-Algorithm (LZMA) compression algorithm, the LZSS compression algorithm, the LZR compression algorithm, the LZB compression algorithm, the LZH compression algorithm, the LZC compression algorithm, the LZT compression algorithm and the like.

For example, the data-transmission RDMA device 101 may select the LZR compression algorithm from the group consisting of the LZW compression algorithm, the LZO compression algorithm, the LZMA compression algorithm, the LZSS compression algorithm, the LZR compression algorithm, the LZB compression algorithm, the LZH compression algorithm, the LZC compression algorithm, and the LZT compression algorithm as the preset compression method. Then the data-transmission RDMA device 101 may compress the raw data using the LZR compression algorithm to obtain the compressed data.

As discussed above, the data-transmission RDMA device 101 may encapsulate the compressed data into the data packet. The method tag may be encapsulated into a transport header of the data packet, and the compressed data may be encapsulated into a user data field of the data packet.

In some embodiments of the specification, a "message" may refer to a data unit exchanged and transmitted over a network (i.e., a data block a site needs to send at a time). A packet may include complete to-be-sent data information, and the length of the packet may vary and may be customizable according to specific requirements. This specification is not limited in this regard. The InfiniBand Trade Association (IBTA) refers to an organization that has established all technical standards related to the InfiniBand technology, which also supplements the standardization of RoCE v1 and v2 and interprets features and characteristics of an RDMA transmission process. InfiniBand Architecture (IBA) refers to the architecture of InfiniBand. A "packet" may include address information of a sender and a receiver, and a data packet may be transmitted over one or more networks along different paths.

An RDMA data packet may include a Routing Header, a Transport Header, a Packet Payload, and a Cyclic Redundancy Check (CRC). The Routing Header may include routing information from the sender to the receiver. The Transport Header may include data bytes transmitted using the IBA and may meet an IBTA standard, and a protocol in the Transport Header may include one or more reserved data bit. The CRC may be a hash function for generating a short check code with a fixed quantity of bits according to data such as a network data packet or a computer file, and may be used to detect or check errors that may occur during data transmission or storage using a principle of division and remainder.

In some embodiments of the specification, 6 bits may be reserved in a current IBTA protocol in a transport message, and one or more bits thereof may be selected according to a compression requirement to show a data compression method. In this case, at most 64 compression algorithms can be supported. Therefore, the method tag may be encapsulated into the reserved bits of the transport message. Certainly, in some embodiments of this specification, a new protocol may be alternatively formulated, and the method tag may be encapsulated by using a non-reserved bit.

After obtaining the raw data, the data-receiving RDMA device 201 may store the raw data to a storage device of the receiving end 200. The storage device may be a device such as a hard disk drive, a solid state disk, a memory, etc. The data-receiving RDMA device 201 may directly store the raw data on the sending end 100 into the storage device without resorting to a processor, thereby effectively reducing latency and improving the data transmission efficiency.

Figure 2:
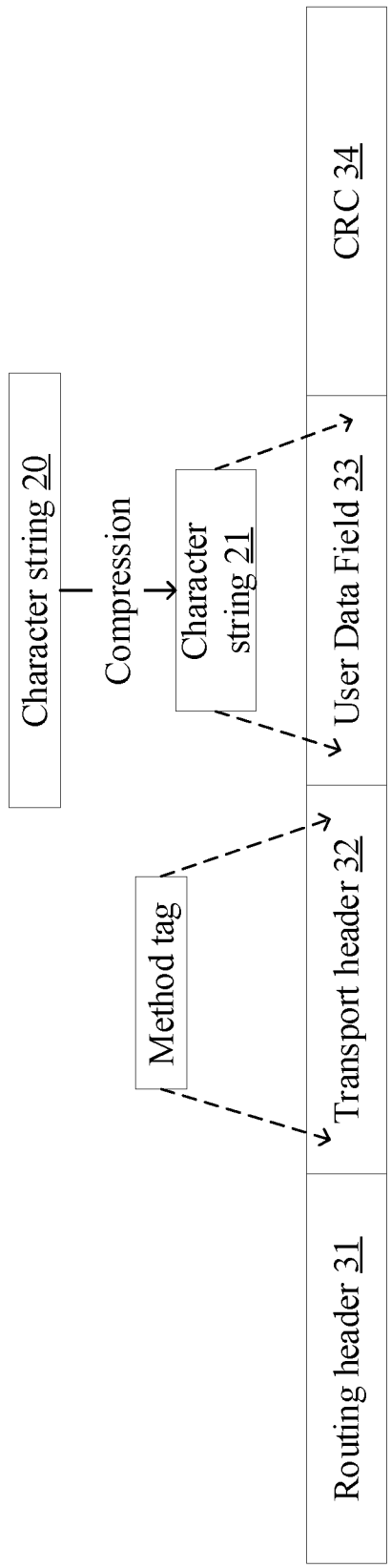
FIG. 2 shows a structural diagram illustrating a data packet according to an embodiment of this specification.

For example, as shown in FIG. 2, the raw data may be data of 20 bytes, represented by a character string 20. The data-transmission RDMA device 101 may compress, using the LZR compression algorithm, the raw data into data of 5 bytes represented by a character string 21. A data packet 30 may include a Routing Header 31, a Transport Header 32, a User Data Field 33, and a CRC 34. The data-transmission RDMA device 101 may encapsulate the character string 21 into the User Data Field 33, encapsulate routing information of the receiving end 200 into the Routing Header 31, encapsulate a method tag 0101 corresponding to the LZR compression algorithm into the Transport Header 32, and fill a check code 101001 in the CRC 34. With all the data been encapsulated into the data packet 30, the data-transmission RDMA device 101 may send the data packet 30 to the receiving end 200.

Correspondingly, the receiving end 200 may be configured to: receive the data packet 30 via the data-receiving RDMA device 201, which may be, for example, a receiving-end RDMA network interface card 201. The receiving-end RDMA network interface card 201 may parse the data packet 30 to obtain the method tag 0101, the character string 21, and the check code 101001. The receiving-end RDMA network interface card 201 may verify the data packet 30 according to the check code 101001. If the data packet passes the verification, indicating that data in the data packet 30 has not been tampered with, the receiving-end RDMA network interface card 201 may identify, from a compression algorithm index table according to the method tag 0101, a compression algorithm corresponding to 0101, which is the LZR compression algorithm in this embodiment. Then, the receiving-end RDMA network interface card 201 may determine a decompression algorithm according to the LZR compression algorithm, decompress the character string 21 using the decompression algorithm to obtain the character string 20, and store the character string 20 in the storage device of the receiving end 200.

Thus, when the sending end 100 sends the character string 20, the data-transmission RDMA device 101 may compress the character string 20 into the character string 21, encapsulate the character string 21 and the method tag 0101 into the data packet 30, and transmit the data packet 30 to the receiving end 200. Thus, what is included in the data packet 30 transmitted to the receiving end 200 is the character string 21 that has a data size of 5 bytes, which is smaller than the data size of the character string 20, which 20 bytes. Therefore, the amount of the data transmitted to the receiving end 200 by the sending end 100 is reduced. With the data transmission capacity in a unit time remains unchanged, reduced data amount to be transmitted leads to improved data transmission efficiency. Thus, this method may improve the data transmission efficiency.

In another embodiment of the specification, the data packet may further include a compression tag indicating that the data in the data packet has been compressed. The compression tag may be encapsulated into the Transport Header of the data packet. Thus, the compression tag may be encapsulated into the one or more reserved bits of the transport message. Alternatively, the compression tag may also be encapsulated, according to a newly formulated protocol, using a non-reserved bit.

For example, referring to FIG. 2, if the compression tag is represented by 1011, the data-transmission RDMA device 101 may encapsulate the character string 21 into the User Data Field 33, encapsulate routing information of the receiving end 200 into the Routing Header 31, encapsulate the method tag 0101 corresponding to the LZR compression algorithm and the compression tag 1011 into the Transport Header 32, and fill the check code 101001 in the CRC 34. With all the data been encapsulated into the data packet 30, the data-transmission RDMA device 101 may send the data packet 30 to the receiving end 200.

Correspondingly, the receiving end 200 may be configured to: receive the data packet 30 via the receiving-end RDMA network interface card 201. The receiving-end RDMA network interface card 201 may parse the data packet 30 to obtain the method tag 0101, the compression tag 1011, the character string 21, and the check code 101001. The receiving-end RDMA network interface card 201 may verify the data packet 30 according to the check code 10001. If the data packet passes the verification, indicating that data in the data packet 30 has not been tampered with, the receiving-end RDMA network interface card 201 may first determine whether there exists a compression tag 1011. In this embodiment, the receiving-end RDMA network interface card 201 may determine that the compression tag 1011 exists because the compression tag 1011 is encapsulated into the data packet. Then the receiving-end RDMA network interface card 201 may obtain the method tag 0101, and identify, from a compression algorithm index table, a compression algorithm corresponding to the method tag 0101, which is the LZR compression algorithm. Next, the receiving-end RDMA network interface card 201 may determine a decompression algorithm according to the LZR compression algorithm, decompress the character string 21 using the decompression algorithm to obtain the character string 20, and store the character string 20 in the storage device of the receiving end 200.

Thus, when the sending end 100 sends the character string 20, the data-transmission RDMA device 101 may compress the character string 20 into the character string 21, encapsulate the character string 21 and the method tag 0101 into the data packet 30, and transmit the data packet 30 to the receiving end 200. Thus, what is included the data packet 30 transmitted to the receiving end 200 is the character string 21 that has a data size of 5 bytes, which is smaller than the data size of the character string 20, which is 20 bytes. Therefore, the amount of the data transmitted to the receiving end 200 by the sending end 100 is reduced. With the data transmission capacity in a unit time remains unchanged, reduced data amount to be transmitted leads to improved data transmission efficiency. Thus, this method may improve the data transmission efficiency.

Moreover, since the compression tag 1011 is encapsulated into the data packet 30, upon receiving the data packet 30, the receiving-end RDMA network interface card 201 can determine, according to the compression tag 1011, whether the transmitted data has been compressed. Only if the data has been compressed, decompression is performed according to the method tag 0101. Otherwise, if the data has not been compressed, the uncompressed data may be directly obtained and stored in the storage device of the receiving end 200. Thus unnecessary decompression process that may otherwise be conducted on uncompressed data transmitted by the data packet 30 may be reduced, if not eliminated, thereby improving the operation performance of the receiving end 200.

Figure 3:
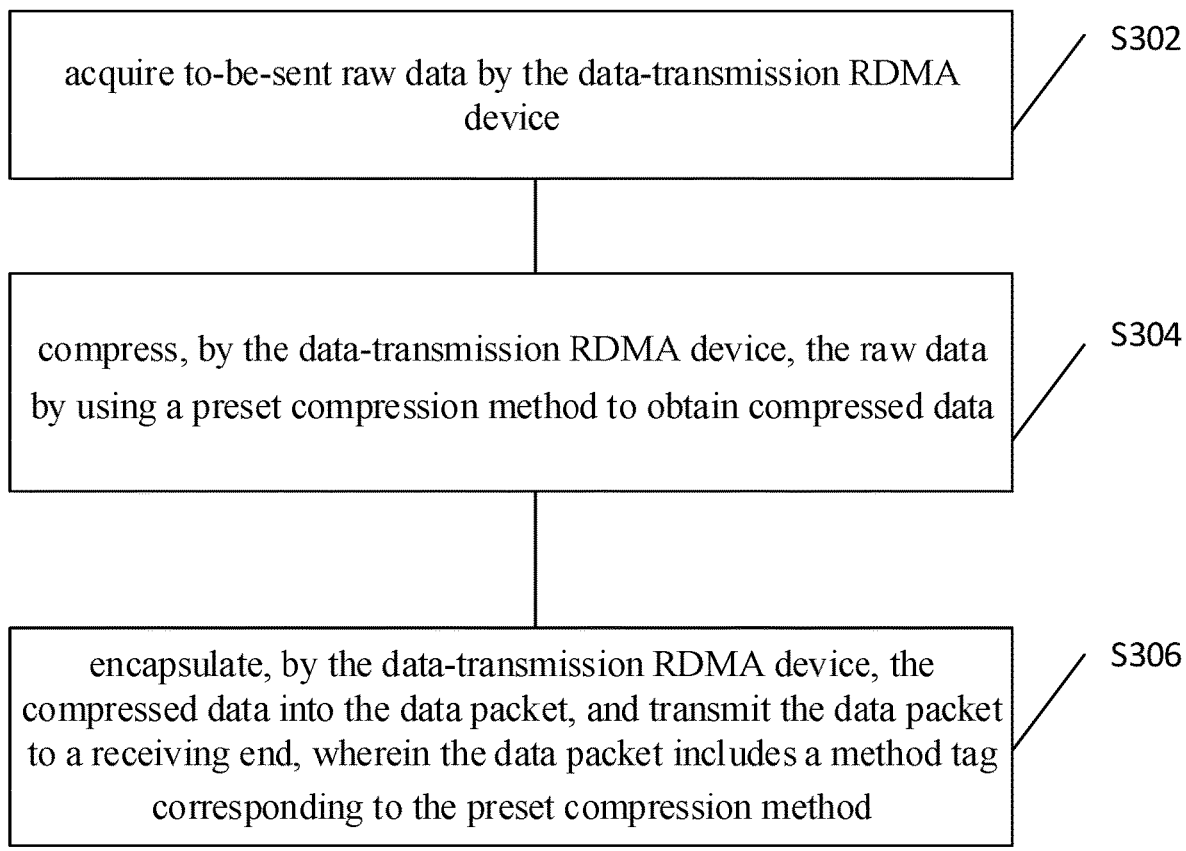
FIG. 3 shows a flowchart illustrating an RDMA data sending method according to an embodiment of this specification.

According to a second aspect, based on the same inventive concept of the first aspect, this specification provides an RDMA data sending method, applicable to a sending end with a data-transmission RDMA device disposed thereon. As shown in FIG. 3, the sending method may include the following steps S302 through S306.

In step S302, to-be-sent raw data may be acquired by the data-transmission RDMA device.

In step S304, the raw data may be compressed by the data-transmission RDMA device using a preset compression method to obtain compressed data.

In step S306, the compressed data may be encapsulated into a data packet by the data-transmission RDMA device, and the data packet may be transmitted to a receiving end. The data packet may include a method tag corresponding to the preset compression method.

The compressed data may be encapsulated into a data packet by the data-transmission RDMA device through the following steps.

First, the data-transmission RDMA device may receive a data compression instruction sent from an RDMA application interface.

Second, the data-transmission RDMA device may obtain the preset compression method in response to the data compression instruction.

Then, the data-transmission RDMA device may compress the raw data using a preset compression method to obtain the compressed data.

The compressed data may be encapsulated into a data packet by the data-transmission RDMA device. The method tag may be encapsulated into a transport header of the data packet, and the compressed data may be encapsulated into a user data field of the data packet.

A compression tag indicating that the data of the data packet has been compressed may be encapsulated into the transport header of the data packet.

Figure 4:
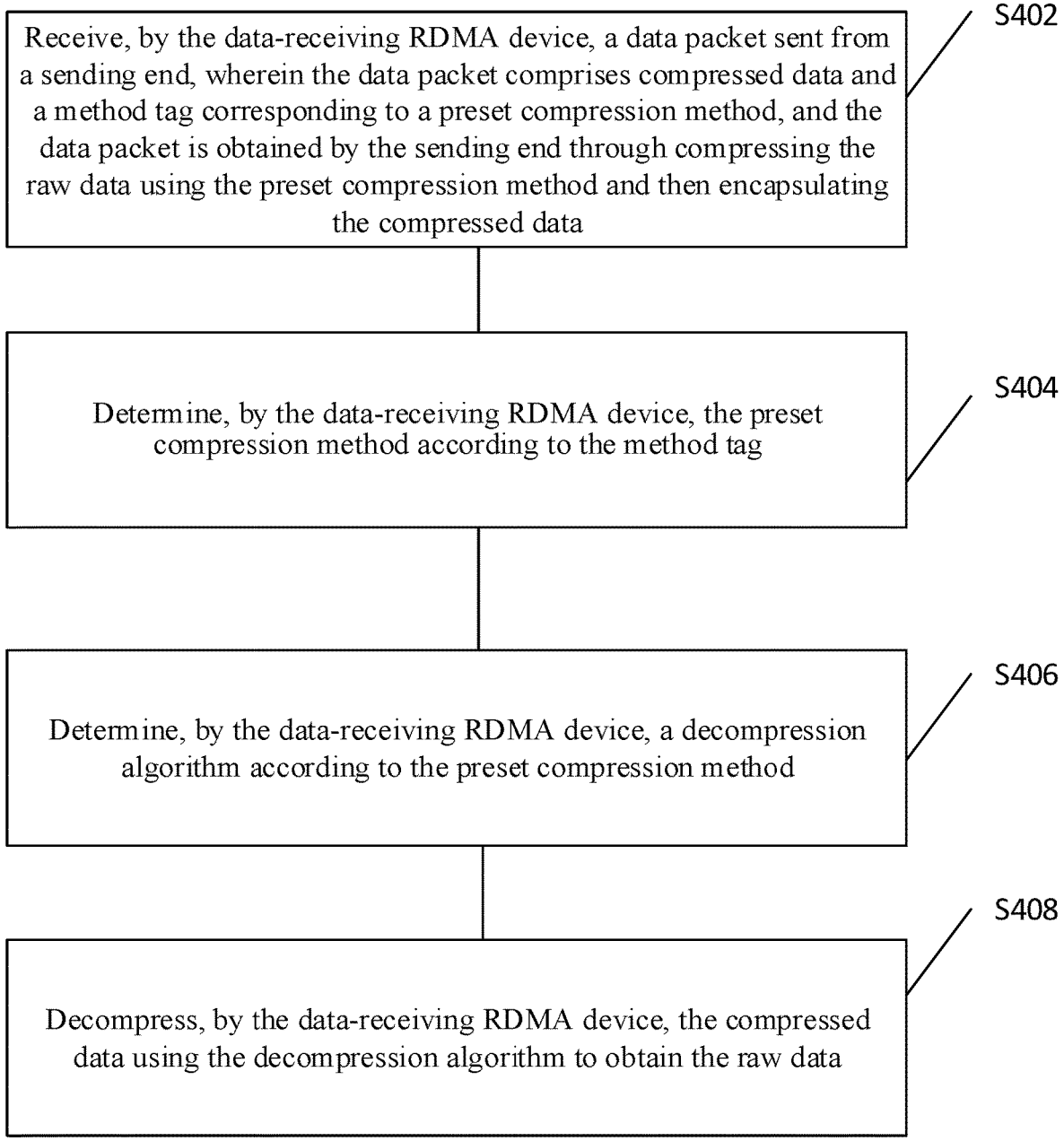
FIG. 4 shows a flowchart illustrating an RDMA data receiving method according to an embodiment of this specification.

According to a third aspect, based on the same inventive concept of the first aspect, this specification provides an RDMA data receiving method, applicable to a receiving end with a data-receiving RDMA device disposed thereon. As shown in FIG. 4, the receiving method include the following steps S402 through S408.

In step S402, a data packet sent from a sending end may be received by the data-receiving RDMA device. The data packet may include compressed data and a method tag corresponding to a preset compression method. The data packet may be obtained by the sending end through compressing the raw data using the preset compression method and then encapsulating the compressed data.

In step S404, the preset compression method may be determined by the data-receiving RDMA device according to the method tag.

In step S406, a decompression algorithm may be determined by the data-receiving RDMA device according to the preset compression method.

In step S408, the compressed data may be decompressed by the data-receiving RDMA device using the decompression algorithm to obtain the raw data.

The determining the preset compression method by the data-receiving RDMA device and according to the method tag may include: determining, by the data-receiving RDMA device and in response to a transport header of the data packet encapsulating, the preset compression method according to the compression tag and the method tag. The compression tag may indicate data of the data packet has been compressed.

After the raw data is obtained, the method may further comprise storing, by the data-receiving RDMA device, the raw data in a storage device of the receiving end.

Figure 5:
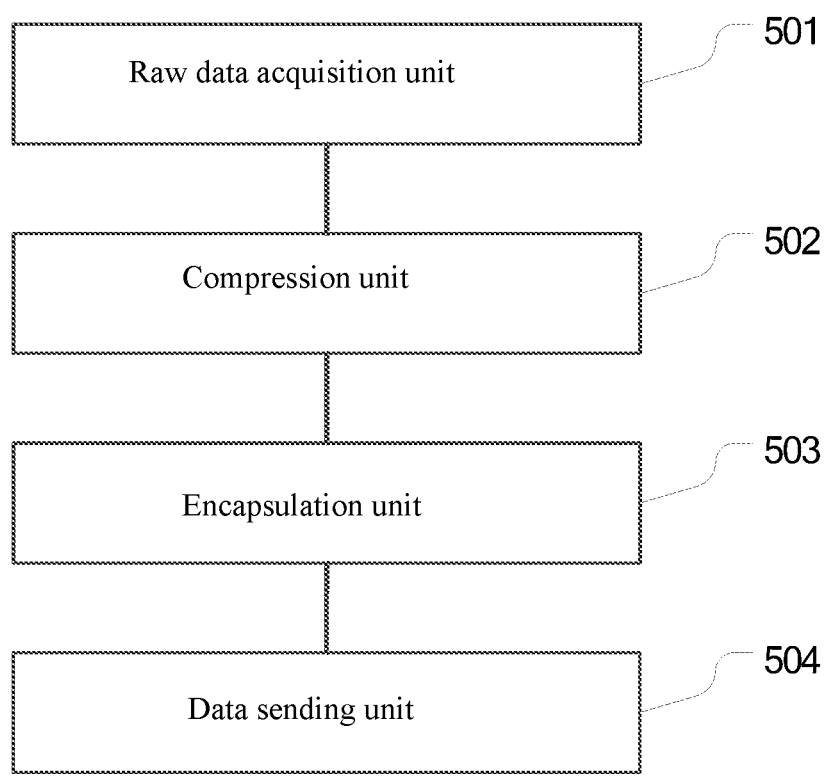
FIG. 5 shows a structural schematic diagram illustrating a sending end according to an embodiment of this specification.

According to a fourth aspect, based on the same inventive concept of the second aspect, this specification provides a sending end, with a data-transmission RDMA device disposed thereon. As shown in FIG. 5, the sending end may include a raw data acquisition unit 501, a compression unit 502, an encapsulation unit 503, and a data sending unit 504.

The raw data acquisition unit 501 may be configured to acquire to-be-sent raw data via the data-transmission RDMA device. The compression unit 502 may be configured to control the data-transmission RDMA device to compress the raw data using a preset compression method to obtain compressed data. The encapsulation unit 503 may be configured to encapsulate the compressed data into a data packet via the data-transmission RDMA device. The data packet may include a method tag corresponding to the preset compression method. The data transmission unit 504 may be configured to transmit the data packet to a receiving end via the data-transmission RDMA device.

The compression unit 502 may be configured to acquire, via the data-transmission RDMA device, a data compression instruction sent from an RDMA application interface, acquire the preset compression method via the data-transmission RDMA device and according to the data compression instruction. The compression unit 502 may be further configured to compress, via the data-transmission RDMA device, the raw data using the preset compression method to obtain the compressed data.

The encapsulation unit 503 may be configured to encapsulate the compressed data into the data packet via the data-transmission RDMA device. The method tag may be encapsulated into a transport header of the data packet, and the compressed data may be encapsulated into a user data field of the data packet.

A compression tag may be encapsulated into the transport header of the data packet. The compression tag may indicate that data of the data packet has been compressed.

Figure 6:
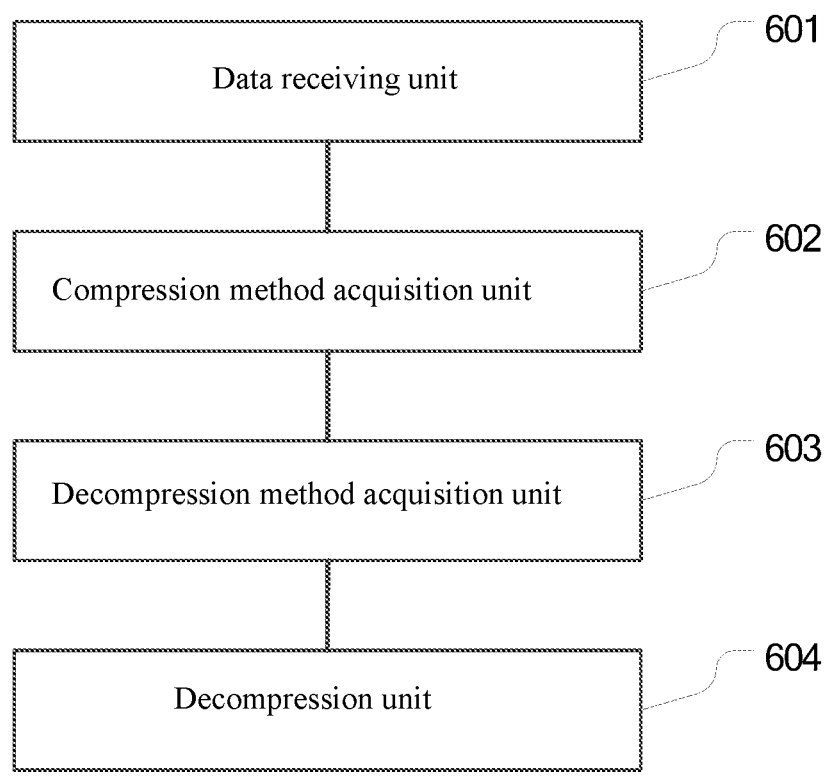
FIG. 6 shows a structural schematic diagram illustrating a receiving end according to an embodiment of this specification.

According to a fifth aspect, based on the same inventive concept of the third aspect, this specification provides a receiving end, with a data-receiving RDMA device is disposed thereon. As shown in FIG. 6, the receiving end may include a data receiving unit 601, a compression method acquisition unit 602, a decompression method acquisition unit 603, and a decompression unit 604.

The data receiving unit 601 may be configured to receive, via the data-receiving RDMA device, a data packet sent from a sending end. The data packet may include compressed data and a method tag corresponding to a preset compression method, and the data packet may be obtained by the sending end by compressing the raw data using the preset compression method and then encapsulating the compressed data.

The compression method acquisition unit 602 may be configured to determine the preset compression method via the data-receiving RDMA device and according to the method tag.

The decompression method acquisition unit 603 may be configured to determine a decompression algorithm via the data-receiving RDMA device and according to the preset compression method.

The decompression unit 604 may be configured to decompress, via the data-receiving RDMA device, the compressed data using the decompression algorithm to obtain the raw data.

The compression method acquisition unit 602 may be configured to: determine, via the data-receiving RDMA device and in response to a transport header of the data packet encapsulating a compression tag, the preset compression method according to the compression tag and the method tag. The compressed tag may indicate that data of the data packet has been compressed.

The receiving end may further include a storage unit. The storage unit may be configured to: after the raw data is obtained, store the raw data in a storage device of the receiving end via the data-receiving RDMA device.

According to a sixth aspect, based on the same inventive concept of the data receiving and sending methods in the foregoing embodiments, this specification further provides an RDMA data transmission system. The system may include a sending-end apparatus and a receiving-end apparatus. The sending-end apparatus may include a data-transmitting RDMA device, and the receiving-end apparatus includes a data-receiving RDMA device.

The data-transmitting RDMA device may have a memory configured with instruction executable to: acquire raw data; compress the raw data using a preset compression method to obtain compressed data; encapsulate the compressed data into a data packet; and transmit the data packet to the data-receiving RDMA device. The data packet may include a method tag corresponding to the preset compression method.

In the RDMA data transmission system, the memory of the data-transmitting RDMA device may be further configured with instructions executable to: acquire a data compression instruction sent from an RDMA application interface; and acquire the preset compression method according to the data compression instruction.

In the RDMA data transmission system, the memory of the data-transmitting RDMA device may be further configured with instructions executable to: encapsulate the method tag into a transport header of the data packet; and encapsulate the compressed data into a user data field of the data packet.

In the RDMA data transmission system, the memory of the data-transmitting RDMA device may be further configured with instructions executable to: encapsulate a compression tag into the transport header of the data packet. The compression tag may indicate data of the data packet has been compressed.

In the RDMA data transmission system, the data-receiving RDMA device may have a memory configured with instructions executable to: receive the data packet; determine the preset compression method according to the method tag in the data packet; determine a decompression algorithm according to the preset compression method; and decompress the compressed data using the decompression algorithm to obtain the raw data.

In the RDMA data transmission system, to determine the preset compression method, the memory of the data-receiving RDMA device may be further configured with instructions executable to: determine the preset compression method according to a compression tag and the method tag. The compression tag may be encapsulated in a transport header of the data packet, and may indicate data of the data packet has been compressed.

In the RDMA data transmission system, the memory of the data-receiving RDMA device may be further configured with instructions executable to: after decompressing the compressed data using the decompression algorithm to obtain the raw data, store the raw data in a storage device.

Figure 7:
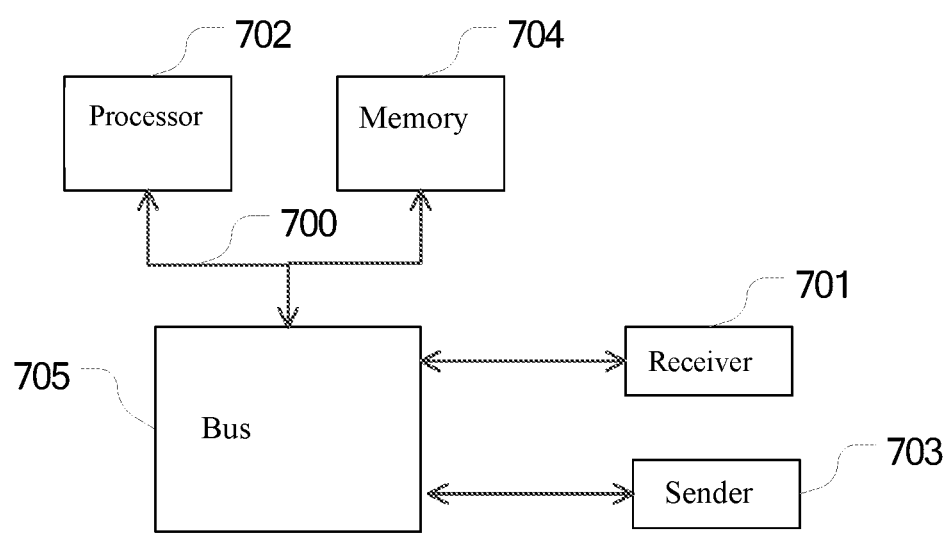
FIG. 7 shows a structural schematic diagram illustrating an electronic device according to an embodiment of this specification.

According to a seventh aspect, based on the same inventive concept of the data receiving and sending methods in the foregoing embodiments, this specification further provides an electronic device. As shown in FIG. 7, this electronic device may include a memory 704, a processor 702, and a computer program stored in the memory 704 and executable on the processor 702. Upon being executed by the processor 702, the program may cause the processor 702 to perform any one of the above-described data receiving and sending methods.

In FIG. 7, a bus architecture is represented by a bus 700. The bus 700 may comprise any number of interconnected buses and bridges, and link together various circuits of one or more processors represented by the processor 702 and a memory represented by the memory 704. The bus 700 may further link together various other circuits such as a peripheral device circuit, a voltage stabilizer circuit, and a power management circuit, which are commonly known in the art and are not described further herein. A bus interface 705 may provide an interface among the bus 700, a receiver 701, and a transmitter 703. The receiver 701 and the transmitter 703 may be the same element, namely a transceiver, to act as a unit for communicating with various other apparatuses on a transmission medium. The processor 702 may be responsible for managing the bus 700 and general processing, and the memory 704 may be used to store data used by the processor 702 when performing operations.

According to an eighth aspect, based on the same inventive concept of the data receiving and sending methods in the foregoing embodiments, this specification further provides a computer-readable storage medium having thereon a computer program stored thereon. Upon being executed by a processor, the computer program may cause the processor to perform any one of the above-described data receiving and sending methods.

The present specification is described with reference to the flowcharts and/or block diagrams of the method, device (system), and computer program product according to some embodiments of this specification. It should be understood that each flow and/or block in the flowcharts and/or the block diagrams, and a combination of the flows and/or the blocks in the flowcharts and/or the block diagrams can be implemented via computer program instructions. The computer program instructions may also be loaded onto a general-purpose computer, a specialized computer, an embedded processor, or the processors of other programmable data processing devices to produce a computer such that the instructions which are executed on the computer or other processors of the programmable apparatus generate a device for implementing the functions specified in one or more flows in a flowchart and/or one or more blocks in a block diagram.

The computer program instructions can also be stored in a computer readable memory which can boot a computer or other programmable data processing devices to operate in a specific manner, such that the instructions stored in the computer readable memory generate a product comprising an instruction apparatus, wherein the instruction apparatus is configured to realize the functions specified in one or more flows in a flowchart and/or one or more blocks in a block diagram.

The computer program instructions can also be loaded to a computer or other programmable data processing devices, so as to execute a series of operation steps on the computer or the other programmable devices to generate a computer reliable process, such that the instructions executed on the computer or the other programmable devices can provide steps for implementing the functions specified in one or more flows in a flowchart and/or one or more blocks in a block diagram.

Although preferred embodiments of this specification have been described, those skilled in the art may make other changes and modifications to these embodiments once they know a basic inventive concept. Therefore, the attached claims are intended to be interpreted to include the preferred embodiments, and all changes and modifications which fall within the scope of this specification.

Obviously, those skilled in the art may make various modifications and variations to this specification without departing from the spirit and scope of this specification. In this way, if these modifications and variations of this specification fall within the scope of the claims of this specification and their equivalent technologies, this specification is also intended to include these modifications and variations.

The invention claimed is:

1. A Remote Direct Memory Access (RDMA) data transmission method, comprising:
receiving, by a data-receiving RDMA device, a data packet including transmitted data and a method tag;
determining whether the data packet includes a compression tag indictive that the data package is compressed; and
conducting, in response to determining that the data packet includes the compression tag, operations comprising:
determining, by the data-receiving RDMA device and according to the method tag, a compression method;
determining, by the data-receiving RDMA device and according to the compression method, a decompression algorithm; and
decompressing, by the data-receiving RDMA device and using the decompression algorithm, the transmitted data to obtain raw data.

2. The method of claim 1, wherein the receiving a data packet including transmitted data and a method tag comprises:
receiving, from a data-transmitting RDMA device, the data packet, wherein each of the data-transmitting RDMA device and the data-receiving RDMA device is a RDMA network interface card.

3. The method of claim 1, wherein a data size of the data packet is smaller than a data size of the raw data.

4. The method of claim 1, wherein the data packet includes a user data field and a transport header, the user data field comprising the transmitted data, and the transport header comprising the method tag,
wherein the determining whether the data packet includes a compression tag indictive that the data package is compressed comprises:
determining whether the transport header of the data packet includes the compression tag.

5. The method of claim 4, wherein the data packet further includes a routing header and a cyclic redundancy check (CRC), the routing header comprising routing information of the data packet, and the CRC comprising a check code of a fixed quantity of bits, generated by a hash function based on the raw data, and
wherein the method further comprises, before determining the compression method:
verifying, according to the check code, the data packet, and
wherein the determining a compression method comprises:
determining, in response to a determination of the data packet being successfully verified, the compression method.

6. The method of claim 4, further comprising, after decompressing the transmitted data to obtain raw data:
storing, by the data-receiving RDMA device, the raw data in a storage device.

7. The method of claim 1, further comprising:
storing, by the data-receiving RDMA device and in response to determining that the data packet does not include the compression tag, the transmitted data in a storage device.

8. A data-receiving RDMA device having a memory configured with instructions executable to cause the data-receiving RDMA device to perform operations comprising:
receiving a data packet including transmitted data and a method tag;
determining whether the data packet includes a compression tag indictive that the data package is compressed; and
conducting, in response to determining that the data packet includes the compression tag, data decompression operations comprising:
determining, according to the method tag, a compression method;
determining, according to the compression method, a decompression algorithm; and
decompressing, using the decompression algorithm, the transmitted data to obtain raw data.

9. The device of claim 8, wherein the receiving a data packet including transmitted data and a method tag comprises:
receiving, from a data-transmitting RDMA device, the data packet, wherein each of the data-transmitting RDMA device and the data-receiving RDMA device is a RDMA network interface card.

10. The device of claim 8, wherein a data size of the data packet is smaller than a data size of the raw data.

11. The device of claim 8, wherein the data packet includes a user data field and a transport header, the user data field comprising the transmitted data, and the transport header comprising the method tag,
wherein the determining whether the data packet includes a compression tag indictive that the data package is compressed comprises:
determining whether the transport header of the data packet includes the compression tag.

12. The device of claim 11, wherein the data packet further includes a routing header and a cyclic redundancy check (CRC), the routing header comprising routing information of the data packet, and the CRC comprising a check code of a fixed quantity of bits, generated by a hash function based on the raw data, and
wherein the data decompression operations further comprise, before determining the compression method:
verifying, according to the check code, the data packet, and
wherein the determining a compression method comprises:
determining, in response to a determination of the data packet being successfully verified, the compression method.

13. The device of claim 11, wherein the data receiving operations further comprise, after decompressing the transmitted data to obtain raw data:
storing the raw data in a storage device.

14. The device of claim 8, wherein the data receiving operations further comprises:
storing, in response to determining that the data packet does not include the compression tag, the transmitted data in a storage device.

15. A non-transitory computer-readable storage medium having instructions stored thereon executable by a processor to cause the processor to perform operations comprising:

receiving a data packet including transmitted data and a method tag;

determining whether the data packet includes a compression tag indictive that the data package is compressed; and conducting, in response to determining that the data packet includes the compression tag, data decompression operations comprising:

determining, according to the method tag, a compression method;

determining, according to the compression method, a decompression algorithm; and decompressing, using the decompression algorithm, the transmitted data to obtain raw data.

16. The storage medium of claim 15, wherein the receiving a data packet including transmitted data and a method tag comprises:

receiving, from a data-transmitting RDMA device, the data packet, wherein each of the data-transmitting RDMA device and the data-receiving RDMA device is a RDMA network interface card.

17. The storage medium of claim 15, wherein a data size of the data packet is smaller than a data size of the raw data.

18. The storage medium of claim 15, wherein the data packet includes a user data field and a transport header, the user data field comprising the transmitted data, and the transport header comprising the method tag, wherein the determining whether the data packet includes a compression tag indictive that the data package is compressed comprises:

determining whether the transport header of the data packet includes the compression tag.

19. The storage medium of claim 18, wherein the data packet further includes a routing header and a cyclic redundancy check (CRC), the routing header comprising routing information of the data packet, and the CRC comprising a check code of a fixed quantity of bits, generated by a hash function based on the raw data, and wherein the data decompression operations further comprise, before determining the compression method:

verifying, according to the check code, the data packet, and wherein the determining a compression method comprises:

determining, in response to a determination of the data packet being successfully verified, the compression method.

20. The storage medium of claim 18, wherein the data receiving operations further comprise, after decompressing the transmitted data to obtain raw data:

storing the raw data in a storage device.

* * * * *